United States Patent
Sun et al.

(10) Patent No.: US 9,711,541 B2
(45) Date of Patent: Jul. 18, 2017

(54) DISPLAY PANEL AND METHOD FOR FORMING AN ARRAY SUBSTRATE OF A DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Yungang Sun, Shanghai (CN); Gujun Li, Shanghai (CN); Di Zhu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/857,632

(22) Filed: Sep. 17, 2015

(65) Prior Publication Data

US 2016/0293631 A1 Oct. 6, 2016

(30) Foreign Application Priority Data

Apr. 1, 2015 (CN) .......................... 2015 1 0152796

(51) Int. Cl.
*H01L 27/12* (2006.01)
*G06F 3/041* (2006.01)

(52) U.S. Cl.
CPC .......... *H01L 27/1259* (2013.01); *G06F 3/041* (2013.01); *H01L 27/124* (2013.01); *H01L 27/1214* (2013.01)

(58) Field of Classification Search
CPC ............... H01L 27/124; H01L 27/1259; H01L 27/1214
See application file for complete search history.

(56) References Cited

U.S. PATENT DOCUMENTS 6,850,307 B2 * 2/2005 Hinata .............. G02F 1/133555
349/114
9,035,310 B2 * 5/2015 Ishii ........................ H01L 33/40
257/59

(Continued)

FOREIGN PATENT DOCUMENTS

| CN | 201465087 U | 5/2010 |
| CN | 103262012 A | 8/2013 |
| CN | 103489879 A | 1/2014 |

OTHER PUBLICATIONS

Chinese Application No. 201510152796.7, First Office Action, issued Apr. 21, 2017.

*Primary Examiner* — Joseph C Nicely
(74) *Attorney, Agent, or Firm* — Alston & Bird LLP

(57) ABSTRACT

The present disclosure provides a display panel and a method for forming an array substrate of a display panel. The display panel includes an array substrate which includes a display region and a frame region. The frame region includes a wire region in which first signal wires are formed. Each of the first signal wires includes a first conductive layer and a second conductive layer which are stacked with each other and electrically connected. As such, to obtain the same resistance value as that in prior art, the first signal wires in the present disclosure can be formed with a reduced width. Therefore, the wire region of the array substrate can have a smaller size, and thus the whole frame region of the display panel can be smaller.

17 Claims, 20 Drawing Sheets

(56) References Cited

U.S. PATENT DOCUMENTS

| | | | |
|---|---|---|---|
| 2007/0290967 A1* | 12/2007 | Jang | G09G 3/3677 |
| | | | 345/87 |
| 2010/0156851 A1* | 6/2010 | Kurokawa | G06F 3/0412 |
| | | | 345/175 |
| 2012/0105392 A1* | 5/2012 | Nagami | G02F 1/1345 |
| | | | 345/204 |
| 2013/0258614 A1 | 10/2013 | Misaki | |
| 2015/0378223 A1* | 12/2015 | Wen | G02F 1/136204 |
| | | | 349/40 |
| 2016/0291424 A1* | 10/2016 | Sun | G06F 3/044 |
| 2016/0291722 A1* | 10/2016 | Du | G06F 3/044 |
| 2016/0293642 A1* | 10/2016 | Zhang | H01L 27/1244 |
| 2016/0300863 A1* | 10/2016 | Koide | H01L 27/1244 |

* cited by examiner

DISPLAY PANEL AND METHOD FOR FORMING AN ARRAY SUBSTRATE OF A DISPLAY PANEL

CROSS REFERENCE TO RELATED APPLICATIONS

The present application claims priority to Chinese patent application No. 201510152796.7, filed on Apr. 1, 2015, and entitled "ARRAY SUBSTRATE AND METHOD FOR FORMING THE SAME, DISPLAY PANEL", the entire disclosure of which is incorporated herein by reference.

TECHNICAL FIELD

The present disclosure generally relates to display technology, and, more particularly, to a display panel and a method for forming an array substrate of a display panel.

BACKGROUND

With the development of display technology, more and more display panels are integrated with touch function to improve customer experience. There are mainly two kinds of touch techniques, mutual-capacitance technique and self-capacitance technique. Touch display devices using self-capacitance technique may only need one touch electrode layer. Therefore, compared with mutual-capacitance, self-capacitance technique is more adapted to the current trend as the market is chasing thinner and lighter display panels. Meanwhile, those skilled in the art are also trying to reduce the size of a frame region in a display panel, such that its display area can be made as large as possible when the entire surface size of the display panel is limited.

Currently, a display panel may include a display region and a frame region. Gates, sources, drains, common electrodes and pixel electrodes may be disposed in the display region, while drive circuits and wires are arranged in the frame region. The wires are used for coupling the drive circuits with the components in the display region. The width of the frame region is mainly depended on the width of a region for placing these wires. However, with the size and resolution of display panels becoming greater and greater, nowadays a display panel needs to accommodate more pixel electrodes. As a result, the number of wires for connecting the pixel electrodes also increases, which means the width of the frame region is not likely to decrease.

SUMMARY

The present disclosure provides a display panel and a method for forming an array substrate of a display panel. The array substrate may have a frame region with a smaller size.

According to disclosed embodiments, a display panel including an array substrate is provided. The array substrate includes a display region and a frame region. The frame region includes a drive circuit region and a wire region. Wires formed in the wire region are adapted for electrically connecting components in the drive circuit region to components in the display region. In the wire region, there are formed a plurality of first signal wires each of which includes a first conductive layer stacked with a second conductive layer. A first insulating layer is disposed between the first and the second conductive layers. There is also a first via between the first and the second conductive layers, through which the first and the second conductive layers are electrically connected. One layer stacked with another layer means the two layers are at least partially overlapped with each other along a direction perpendicular to the array substrate. However, more than two layers stacked with each other means each layer is at least partially overlapped with at least another one of the layers along the direction perpendicular to the array substrate.

According to disclosed embodiments, a method for forming an array substrate of a display panel is provided. The method includes: providing a first substrate; forming a first conductive layer in a first signal wire region of a wire region, where the wire region is disposed on a first surface of the first substrate; forming a first insulating layer overlaying the first conductive layer; forming a first via in the first insulating layer, where the first via is in contact with the first conductive layer; and forming a second conductive layer on the first insulating layer, where the first and the second conductive layers are electrically connected through the first via.

According to disclosed embodiments, a display panel is provided. The display panel includes a display region and a frame region. The frame region includes a drive circuit region and a wire region. Wires formed in the wire region are adapted for electrically connecting components in the drive circuit region to components in the display region. In the wire region, there are formed a first signal wire layer stacked with a second signal wire layer. There is a first insulating layer disposed between the first and the second signal wire layers. The first signal wire layer includes a plurality of first signal wires extending along a first direction, and the second signal wire layer includes a plurality of second signal wires extending along the first direction. Furthermore, at least one of the first signals wires and one of the second signal wires are at least partially overlapped along a direction perpendicular to the array substrate.

DETAILED DESCRIPTION

In order to clarify the objects, characteristics and advantages of the disclosure, embodiments of the disclosure will be interpreted in detail in combination with accompanied drawings.

Figure 1:
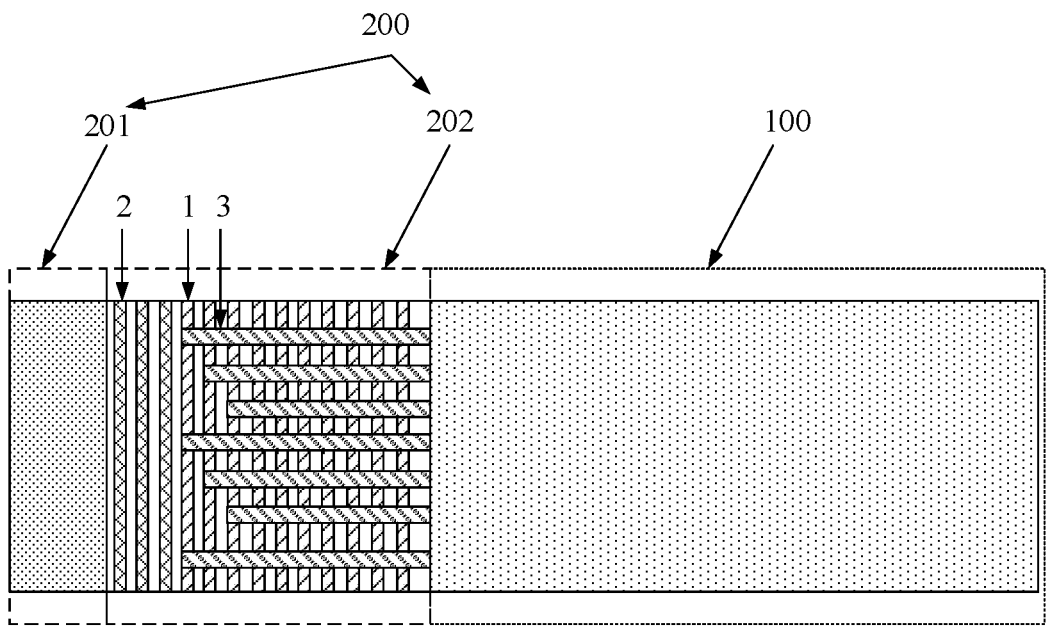
FIG. 1 is a top view of an array substrate according to an embodiment.
Figure 2:
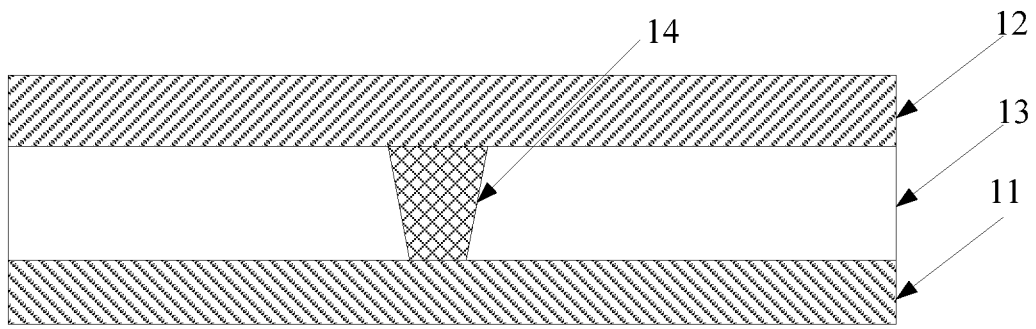
FIG. 2 is a cross section of a first signal wire in an array substrate according to disclosed embodiments.

FIG. 1 is a top schematic view of an array substrate according to an embodiment of the present disclosure. As shown in FIG. 1, the array substrate includes a display region 100 and a frame region 200. The frame region 200 includes a drive circuit region 201 and a wire region 202. In the wire region 202, there are formed a plurality of first signal wires 1 for connecting drive circuits (not shown in FIG. 1) in the drive circuit region 201 with components in the display region 100. FIG. 2 schematically illustrates a cross section of an example of the first signal wire. Referring to FIG. 2, the first signal wire 1 may include a stack of a first conductive layer 11 and a second conductive layer 12, and an insulating layer 13 disposed between the first and the second conductive layers 11 and 12. A first via 14 is formed through the first insulating layer 13, such that the first and the second conductive layers 11 and 12 can be electrically coupled.

Figure 3:
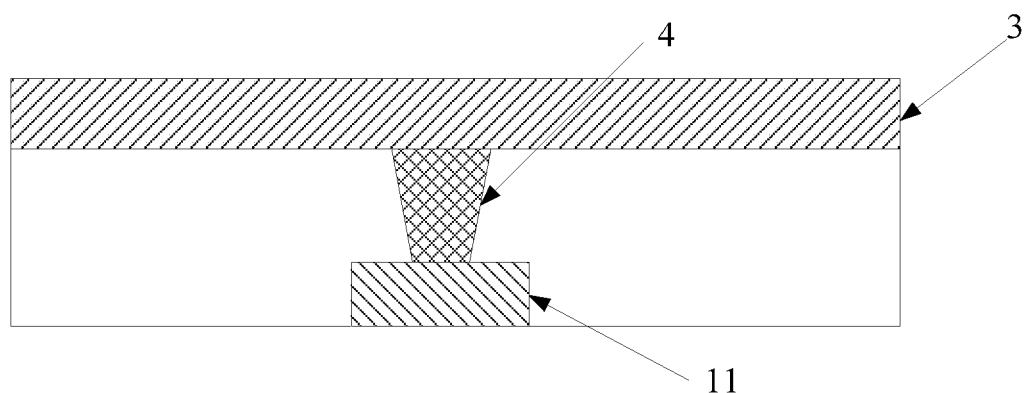
FIG. 3 illustrates how a first signal wire is electrically connected with a third signal wire according to disclosed embodiments.

Further referring to FIG. 1, in some embodiments, there are multiple connecting wires 3 disposed in the wire region 202. The connecting wires 3 are adapted for electrically coupling a plurality of gate drive units (not shown in FIG. 1) in the wire region 202 with the first signal wires 1, such that drive signals can be transmitted from the first signal wires 1 to the gate drive units through the connecting wires 3. FIG. 3 schematically illustrates an example of a connection mode between the first signal wire and the connecting wire. As shown in FIG. 3, the connecting wire 3 may be electrically connected with the first conductive layer 11 of the first signal 1 through a second via 4.

As stated above, in some embodiments, the connecting wire 3 may be connected with the first conductive layer 11 of the first signal wire 1, so as to establish electrical connection with the first signal wire. It should be noted that the present disclosure is not limited by such configuration. In some embodiments, the electrical connection may be established by connecting the connecting wire 3 with the second conductive layer 12 of the first signal wire 1.

Also, it should be noted that, in some embodiments, the connecting wires 3 may be coupled with other drive units, so that drive signals can be transmitted to these drive units.

Figure 4:
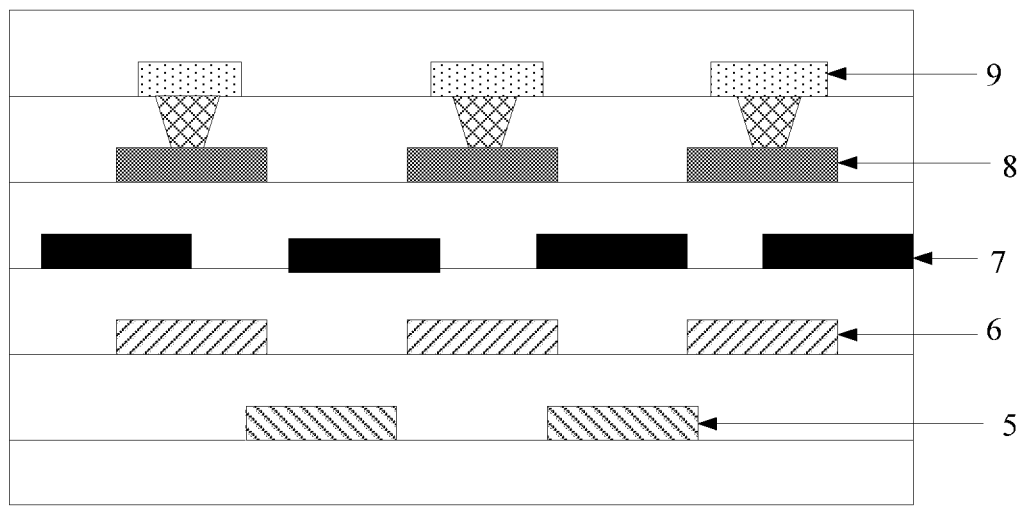
FIG. 4 is a cross section of a display region in an array substrate according to disclosed embodiments.

FIG. 4 is a cross section view of the display region 100 according to disclosed embodiments. The display region 100 may include a gate layer 5 in which gate electrodes are formed, a source/drain layer 6 in which source and drain electrodes are formed, a pixel electrode layer 7 in which pixel electrodes are formed, a common electrode layer 8 in which common electrodes are formed, and a signal transmitting wire layer 9 in which signal transmitting wires are formed. In some embodiments, the common electrode layer 8 may have a plurality of touch units formed therein. The touch units may function as common electrodes in a display period, and also function as touch electrodes in a touch period. Accordingly, the signal transmitting wires in the signal transmitting wire layer 9 are electrically connected with the touch units, so as to transmit common voltage signals to the touch units in the display period, and transmit touch signals to the touch units in the touch period.

Figure 5:
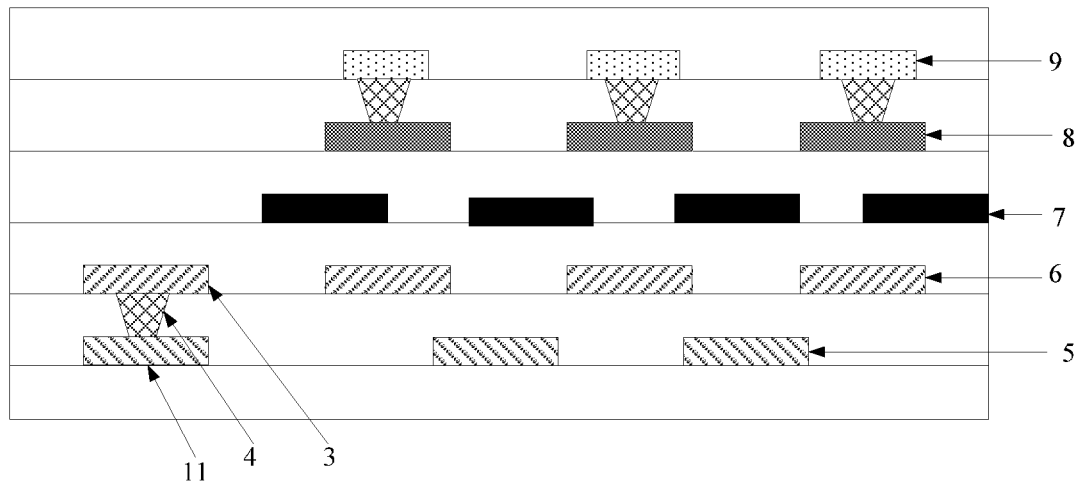
FIGS. 5 to 9 are cross sections of array substrates according to disclosed embodiments.
Figure 6:
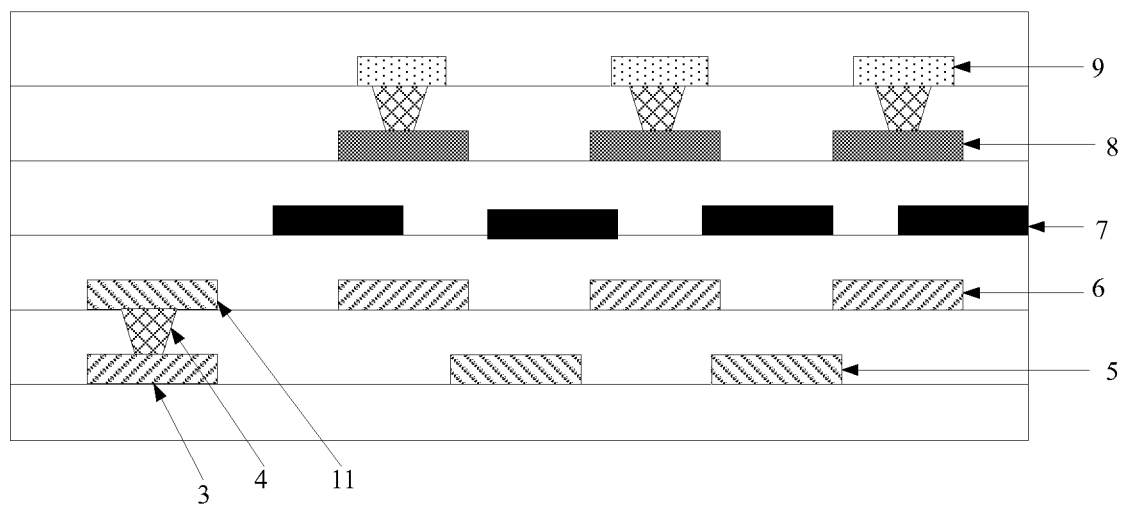

FIG. 5 is a schematic cross-sectional view of the array substrate according to disclosed embodiments. As shown in FIG. 5, in some embodiments, the first conductive layer 11 of the first signal wire 1 in the wire region is disposed on the same layer with the gate layer 5 in the display region, and the connecting wire 3 is disposed on the same layer with the source/drain layer 6. In the present disclosure, layers and/or components being disposed on the same layer means these layers and/or components are disposed at the same or substantially the same height. The height described herein is measured along a direction perpendicular to the array substrate or a display panel including the array substrate. It should be noted that the present disclosure may not be limited by such configuration. In some embodiments, the first conductive layer 11 may be disposed on the same layer with the source/drain layer 6, and the connecting wire 3 may be disposed on the same layer with the gate layer 5.

Figure 7:
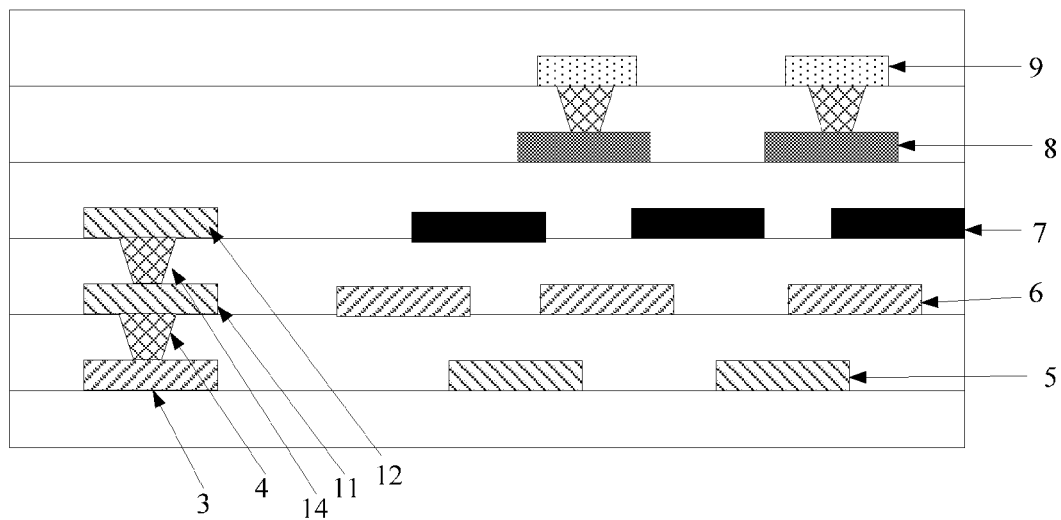
Figure 8:
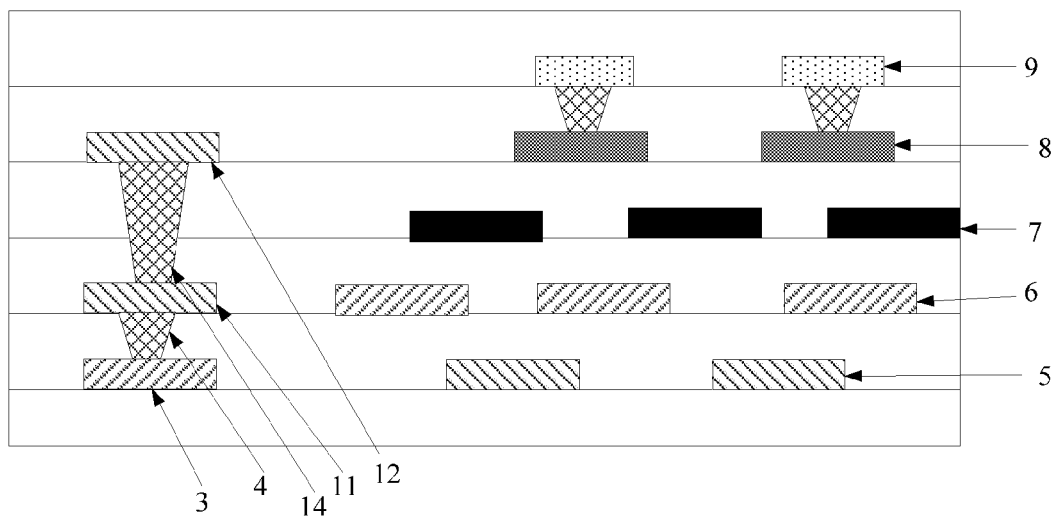
Figure 9:
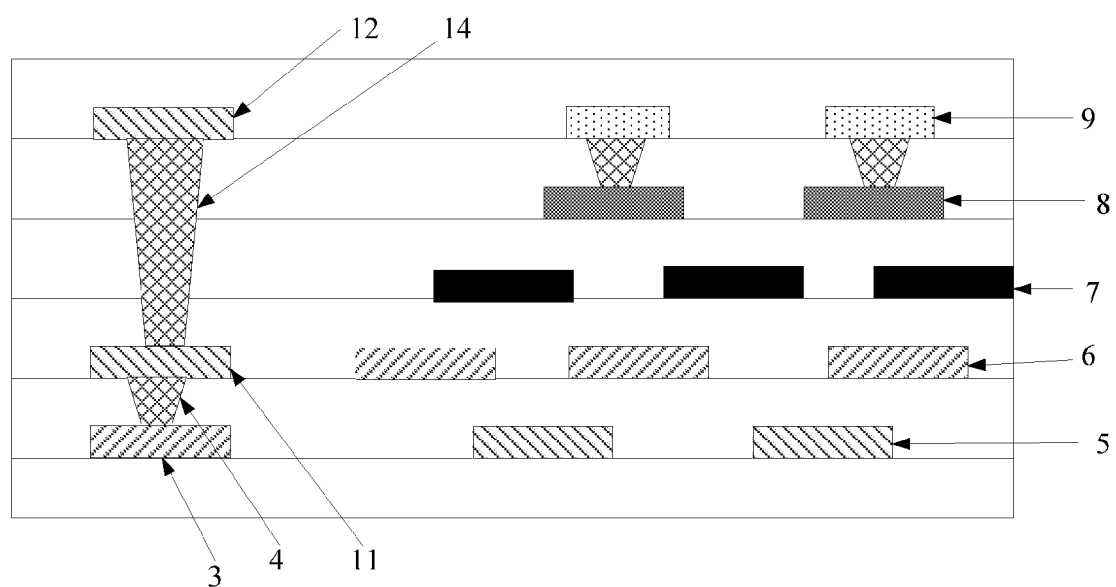

FIGS. 7 to 9 are schematic cross-sectional view of other examples of the array substrate. Specifically, optional positions of the second conductive layer 12 are illustrated. As shown in FIG. 7, in some embodiments, the second conductive layer 12 may be disposed on the same layer with the pixel electrode layer 7. As shown in FIG. 8, in some embodiments, the second conductive layer 12 may be disposed on the same layer with the common electrode layer 8. As shown in FIG. 9, in some embodiments, the second conductive layer 12 may be disposed on the same layer with the signal transmitting wire layer 9.

From the above descriptions, it can be seen that both the first conductive layer 11 and the second conductive layer 12 are disposed on the same layer with two of the layers in the display region. However, the present disclosure is not limited by such configuration. In some embodiments, only one of the first conductive layer 11 and the second conductive layer 12 is disposed on the same layer with one of the layers in the display region 100. In some embodiments, none of the first conductive layer 11 and the second conductive layer 12 is disposed on the same layer with any one of the layers in the display region 100.

In some embodiments, the second conductive layer 12 is disposed on the same layer with the pixel electrode layer 7, and the pixel electrodes in the pixel electrode layer 7 may be transparent electrodes. In such occasion, the second conductive layer also may be formed as a transparent electrode. As such, the second conductive layer 12 and the pixel electrode layer 7 can be formed in the same process, which means the whole formation process of the array substrate can be simplified. Therefore, production efficiency may be improved, and cost may be reduced. In some embodiments, the second conductive layer 12 is disposed on the same layer with the signal transmitting wire layer 9, and the signal transmitting wire layer 9 may be formed as a metal wire layer to reduce the resistance thereof. In such occasion, the second conductive layer also may be formed as a metal conductive layer. As such, the second conductive layer 12 and the signal transmitting wire layer 9 can be formed in the same process, which means the whole formation process of the array substrate can be simplified. Therefore, production efficiency may be improved, and cost may be reduced. Furthermore, using metal material to form the second conductive layer 12 can reduce the resistance thereof, which means the first signal wire 1 can be formed narrower to obtain the same resistance compared with other material. Accordingly, the frame region of the array substrate can be further reduced. Similarly, in some embodiments, the second conductive layer 12 may be formed on the same layer with the common electrode layer 8, and formed with a material the same as that of the common electrode layer 8.

Figure 10:
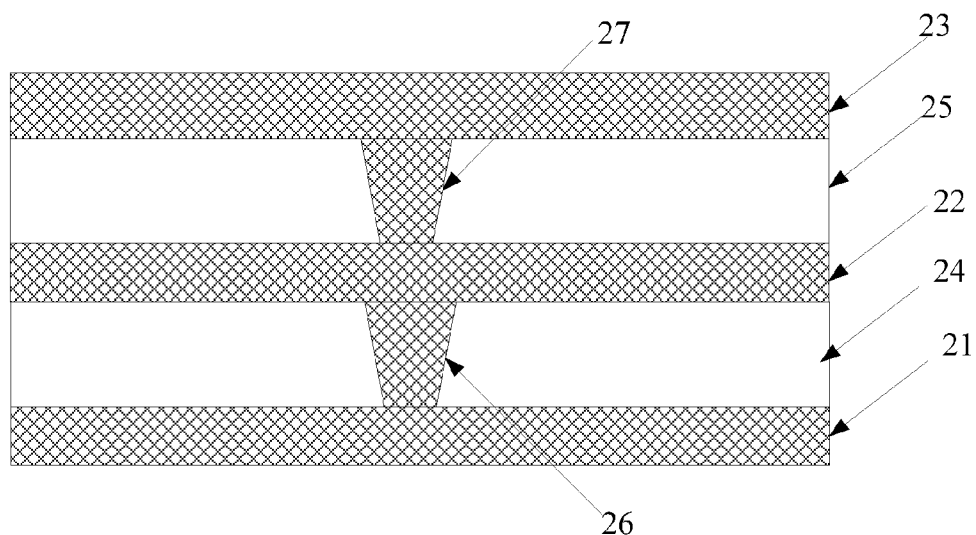
FIG. 10 is a cross section of a second signal wire according to disclosed embodiments.

Except for the components described above, in some embodiments, referring back to FIG. 1, the wire region 202 further includes a plurality of second signal wires 2. FIG. 10 is a schematical cross-sectional view of an example of the second signal wire according to disclosed embodiments. Referring to FIG. 10, the second signal wire 2 may include a stack of a third conductive layer 21, a fourth conductive layer 22 and a fifth conductive layer 23. A second insulating layer 24 is disposed between the third conductive layer 21 and the fourth conductive layer 22, and a third insulating layer 25 is disposed between the fourth conductive layer 22 and the fifth conductive layer 23. A third via 26 is formed between the third conductive layer 21 and the fourth conductive layer 22, so as to electrically connect the third conductive layer 21 and the fourth conductive layer 22. A fourth via 27 is formed between the fourth conductive layer 22 and the fifth conductive layer 23, so as to electrically connect the fourth conductive layer 22 and the fifth conductive layer 23.

It should be noted that there are various options for specific positions of the third conductive layer 21, the fourth conductive layer 22 and the fifth conductive layer 23. In some embodiments, any one of the third conductive layer 21, the fourth conductive layer 22 and the fifth conductive layer 23 may be disposed not on the same layer with any one of the gate layer 5, the source/drain layer 6, the pixel electrode layer 7, the common electrode layer 8 and the signal transmitting wire layer 9. In some embodiments, any one of the third conductive layer 21, the fourth conductive layer 22 and the fifth conductive layer 23 may be disposed on the same layer with any one of the gate layer 5, the source/drain layer 6, the pixel electrode layer 7, the common electrode layer 8 and the signal transmitting wire layer 9. As long as the third conductive layer 21, the fourth conductive layer 22 and the fifth conductive layer 23 are not all set on the same layer, and they are electrically connected with each other, the width of the wire region can be reduced under the circumstance that the resistance value remains. Therefore, the area of the frame region of the array substrate can be reduced.

Figure 11:
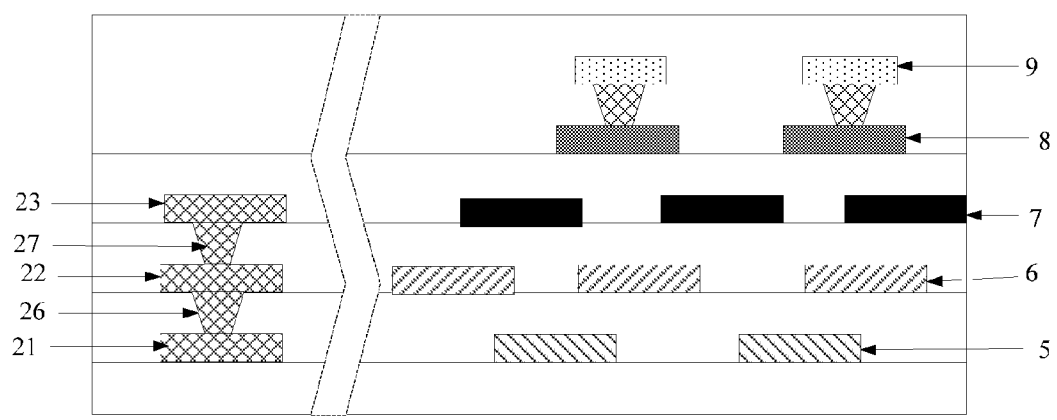
FIGS. 11 to 20 are cross sections of array substrates according to disclosed embodiments.

FIGS. 11 to 20 are schematic across-sectional views of array substrates according to disclosed embodiments. As shown in FIG. 11, in some embodiments, the third conductive layer 21 is disposed on the same layer with the gate layer 5; the fourth conductive layer 22 is disposed on the same layer with the source/drain layer 6; and the fifth conductive layer 23 is disposed on the same layer with the pixel electrode layer 7.

Figure 12:
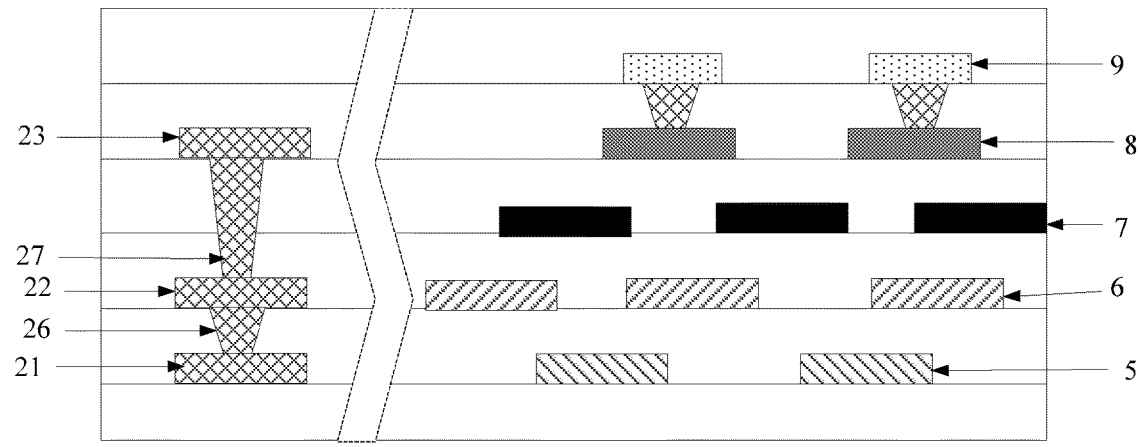

As shown in FIG. 12, in some embodiments, the third conductive layer 21 is disposed on the same layer with the gate layer 5; the fourth conductive layer 22 is disposed on the same layer with the source/drain layer 6; and the fifth conductive layer 23 is disposed on the same layer with the common electrode layer 8.

Figure 13:
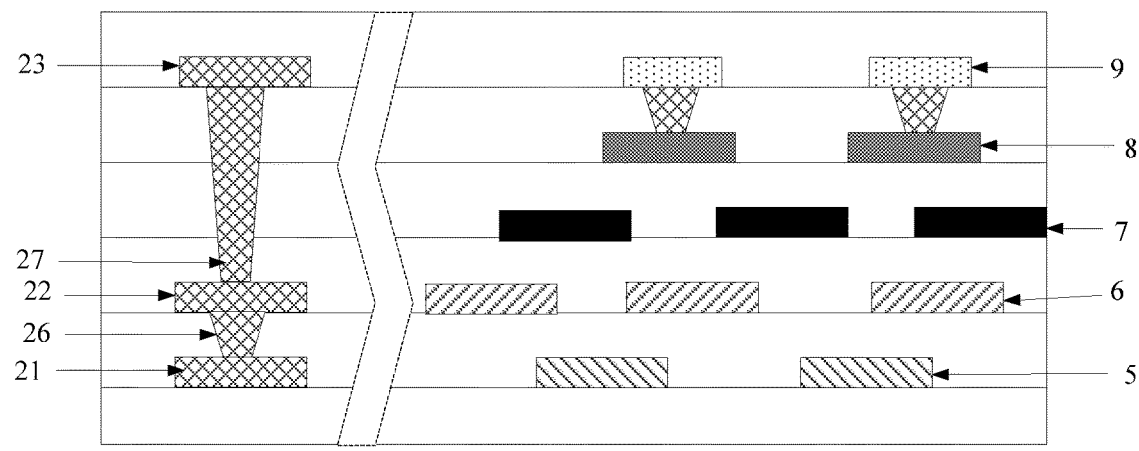

As shown in FIG. 13, in some embodiments, the third conductive layer 21 is disposed on the same layer with the gate layer 5; the fourth conductive layer 22 is disposed on the same layer with the source/drain layer 6; and the fifth conductive layer 23 is disposed on the same layer with the signal transmitting wire layer 9.

Figure 14:
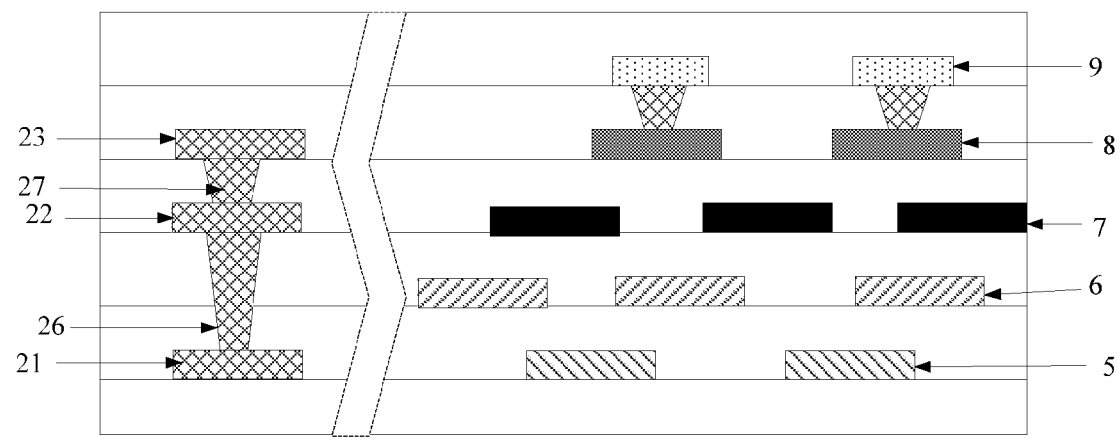

As shown in FIG. 14, in some embodiments, the third conductive layer 21 is disposed on the same layer with the gate layer 5; the fourth conductive layer 22 is disposed on the pixel electrode layer 7; and the fifth conductive layer 23 is disposed on the same layer with the common electrode layer 8.

Figure 15:
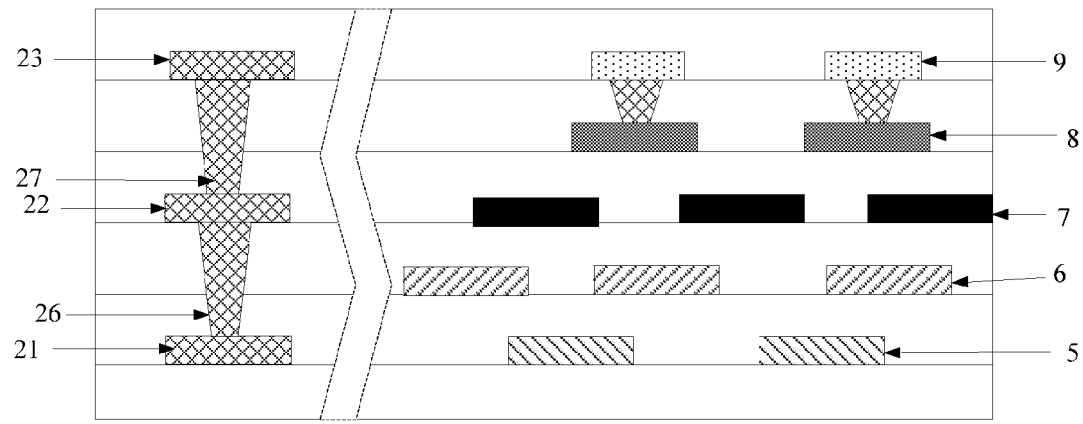

As shown in FIG. 15, in some embodiments, the third conductive layer 21 is disposed on the same layer with the gate layer 5; the fourth conductive layer 22 is disposed on the pixel electrode layer 7; and the fifth conductive layer 23 is disposed on the same layer with the signal transmitting wire layer 9.

Figure 16:
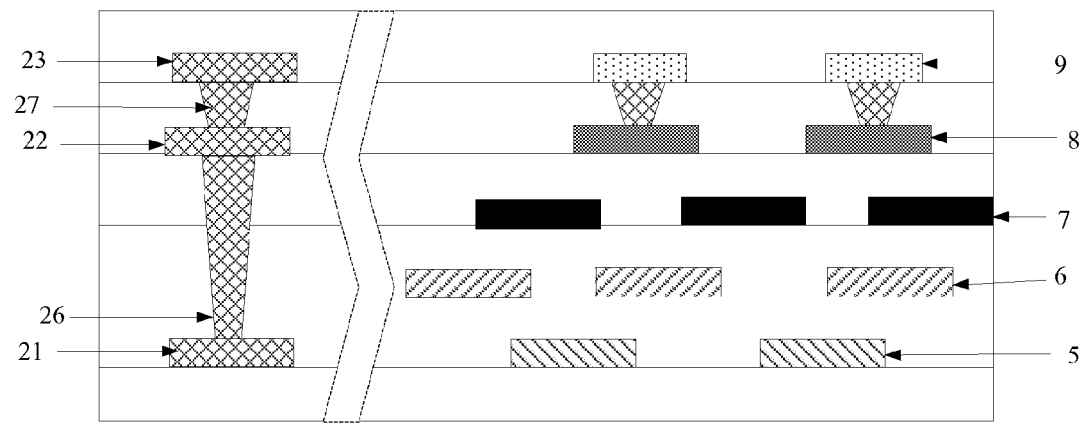

As shown in FIG. 16, in some embodiments, the third conductive layer 21 is disposed on the same layer with the gate layer 5; the fourth conductive layer 22 is disposed on the common electrode layer 8; and the fifth conductive layer 23 is disposed on the same layer with the signal transmitting wire layer 9.

Figure 17:
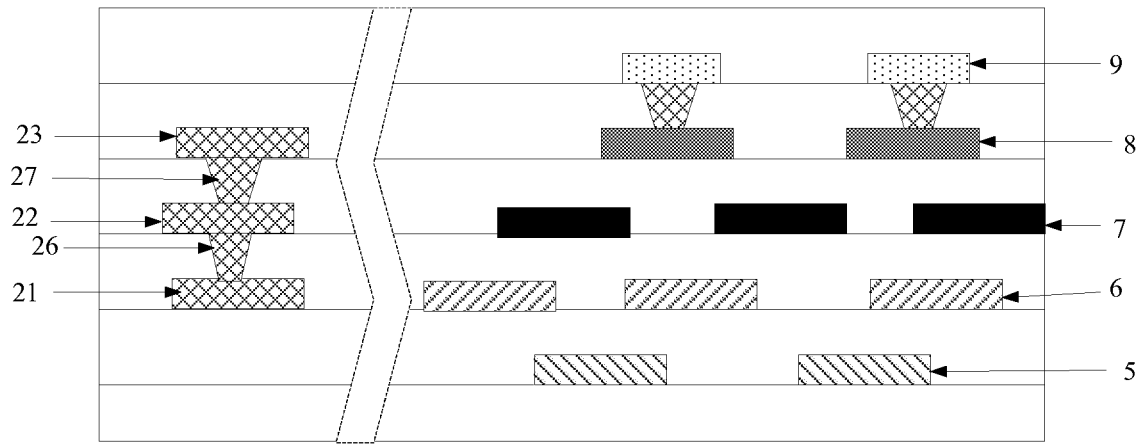

As shown in FIG. 17, in some embodiments, the third conductive layer 21 is disposed on the source/drain layer 6; the fourth conductive layer 22 is disposed on the pixel electrode layer 7; and the fifth conductive layer 23 is disposed on the same layer with the common electrode layer 8.

Figure 18:
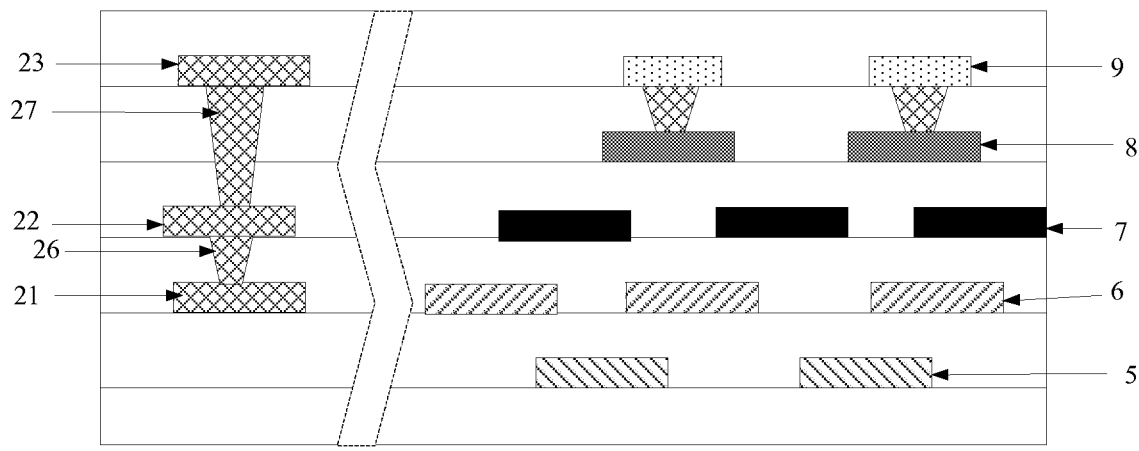

As shown in FIG. 18, in some embodiments, the third conductive layer 21 is disposed on the source/drain layer 6; the fourth conductive layer 22 is disposed on the pixel electrode layer 7; and the fifth conductive layer 23 is disposed on the same layer with the signal transmitting wire layer 9.

Figure 19:
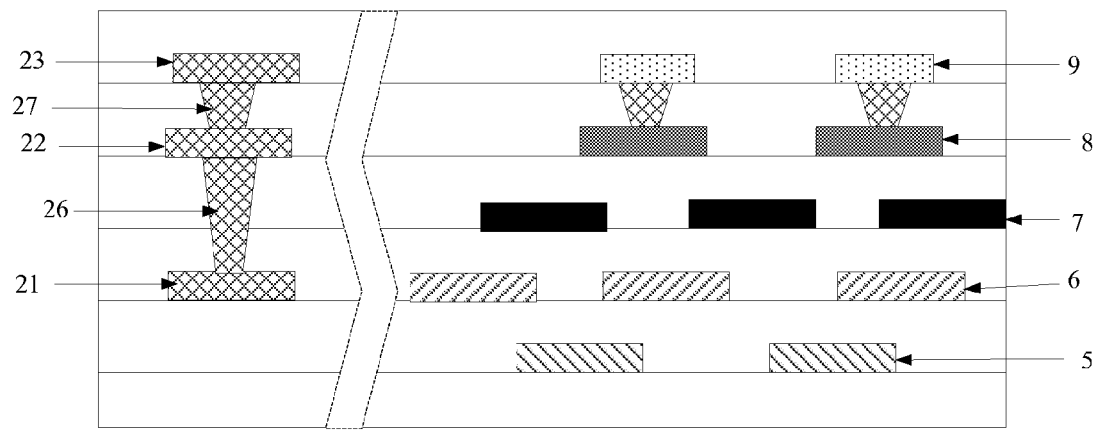

As shown in FIG. 19, in some embodiments, the third conductive layer 21 is disposed on the source/drain layer 6; the fourth conductive layer 22 is disposed on the common electrode layer 8; and the fifth conductive layer 23 is disposed on the same layer with the signal transmitting wire layer 9.

Figure 20:
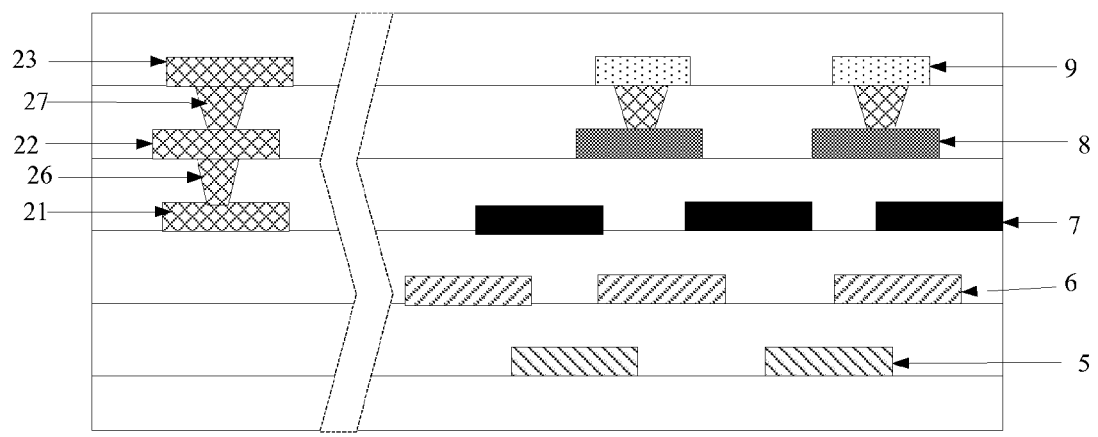

As shown in FIG. 20, in some embodiments, the third conductive layer 21 is disposed on the pixel electrode layer 7; the fourth conductive layer 22 is disposed on the common electrode layer 8; and the fifth conductive layer 23 is disposed on the same layer with the signal transmitting wire layer 9.

It should be noted that the present disclosure is not limited by above embodiments. Specific positions of the pixel electrode layer 7, the common electrode 8 and the signal transmitting wire layer 9 may vary according to practical requirements.

Figure 21:
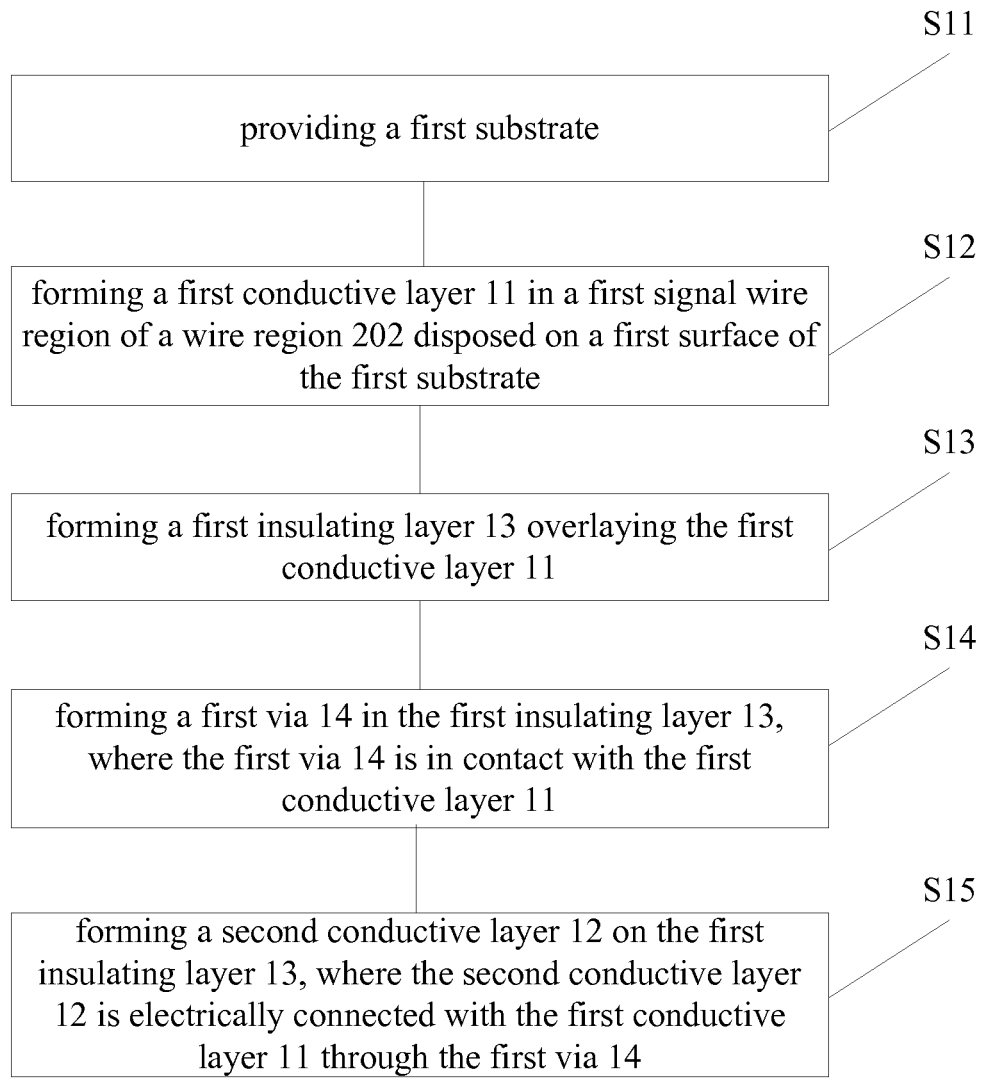
FIG. 21 is a flow chart of a process for forming an array substrate according to disclosed embodiments.

Accordingly, a method for forming an array substrate is provided. FIG. 21 schematically illustrates a flow chart of the process for forming the array substrate, which includes:

S11: providing a first substrate;

S12: forming a first conductive layer 11 in a first signal wire region of a wire region 202 disposed on a first surface of the first substrate;

S13: forming a first insulating layer 13 overlaying the first conductive layer 11;

S14: forming a first via 14 in the first insulating layer 13, where the first via 14 is in contact with the first conductive layer 11; and S15: forming a second conductive layer 12 on the first insulating layer 13, where the second conductive layer 12 is electrically connected with the first conductive layer 11 through the first via 14.

Specifically, in some embodiments, the method may include: providing the first substrate; forming a conductive layer on the first surface of the first substrate and etching the conductive layer to forming the first conductive layer 11 in the first signal wire region of the wire region disposed on the first surface of the first substrate; forming the first insulating layer 13 on the first conductive layer 11 to completely overlay the first conductive layer 11; etching the first insulating layer 13 to form a through hole partially exposing the first conductive layer 11, and forming the first via 14 in the through hole, such that the first via 14 is in contact with the first conductive layer 11; and forming a conductive layer on the first insulating layer 13, and etching the conductive layer to form the second conductive layer 12 in the first signal wire region, such that the second conductive layer 12 is electrically connected with the first conductive layer 11 through the first via 14.

In some embodiments, the method may further include: forming, in the wire region disposed on the first surface of the first substrate, a plurality of gate drive units and a plurality of connecting wires 3 electrically connected with the gate drive units. Each of the connecting wires 3 is electrically connected with one of the first signal wires 1 through a second via 4, such that drive signals can be transmitted from the first signal wires 1 to the gate drive units.

In some embodiments, the connecting wire 3 and the second conductive layer 12 may be formed on opposite sides of the first conductive layer 11, such that the connecting wire 3 can be electrically connected with the first conductive layer 11, i.e., electrical connection between the connecting wire 3 and the first signal wire 1 can be established. In some embodiments, the connecting wire 3 and the first conductive layer 11 may be formed on opposite sides of the second conductive layer 12, such that the connecting wire 3 can be electrically connected with the second conductive layer 12, i.e., electrical connection between the connecting wire 3 and the first signal wire 1 can be established. In some embodiments, the connecting wire 3 may be formed between the first conductive layer 11 and the second conductive layer 12, such that the connecting wire 3 can be electrically connected with both the first conductive layer 11 and the second conductive layer 12, i.e., electrical connection between the connecting wire 3 and the first signal wire 1 can be established.

It should be noted that, in some embodiment, the connecting wire 3 may be used for providing drive signals to other drive units.

In some embodiments, the method may further include: forming, in the display region disposed on the first surface of the first substrate, a gate layer 5, a source/drain layer 6, a pixel electrode layer 7, a common electrode layer 8 and a signal transmitting wire layer 9. In some embodiments, the common electrode layer 8 may have a plurality of touch units formed therein. The touch units may function as common electrodes in a display period, and also function as touch electrodes in a touch period. Accordingly, signal transmitting wires formed in the signal transmitting wire layer 9 are electrically connected with the touch units, so as to transmit common voltage signals to the touch units in the display period, and transmit touch signals to the touch units in the touch period.

In some embodiments, the first conductive layer 11 and the gate layer 5 may be formed in the same process, and the connecting wire 3 and the source/drain layer 6 may be formed in the same process, such that the whole formation process of the array substrate can be simplified. Therefore, production efficiency may be improved, and cost may be reduced. In some embodiments, the first conductive layer 11 and the source/drain layer 6 may be formed in the same process, and the connecting wire 3 and the gate layer 5 may be formed in the same process, such that the whole formation process of the array substrate can be simplified. Therefore, production efficiency may be improved, and cost may be reduced. In some embodiments, the first conductive layer 11 and the connecting wire 3 may be formed in individual processes without being formed with any other component.

As for the second conductive layer 12, it may be formed in an individual process, or in the same process with the pixel electrode layer 7, the common electrode layer 8 or the signal transmitting wire layer 9, such that the whole formation process of the array substrate can be simplified. Therefore, production efficiency may be improved, and cost may be reduced.

Figure 22:
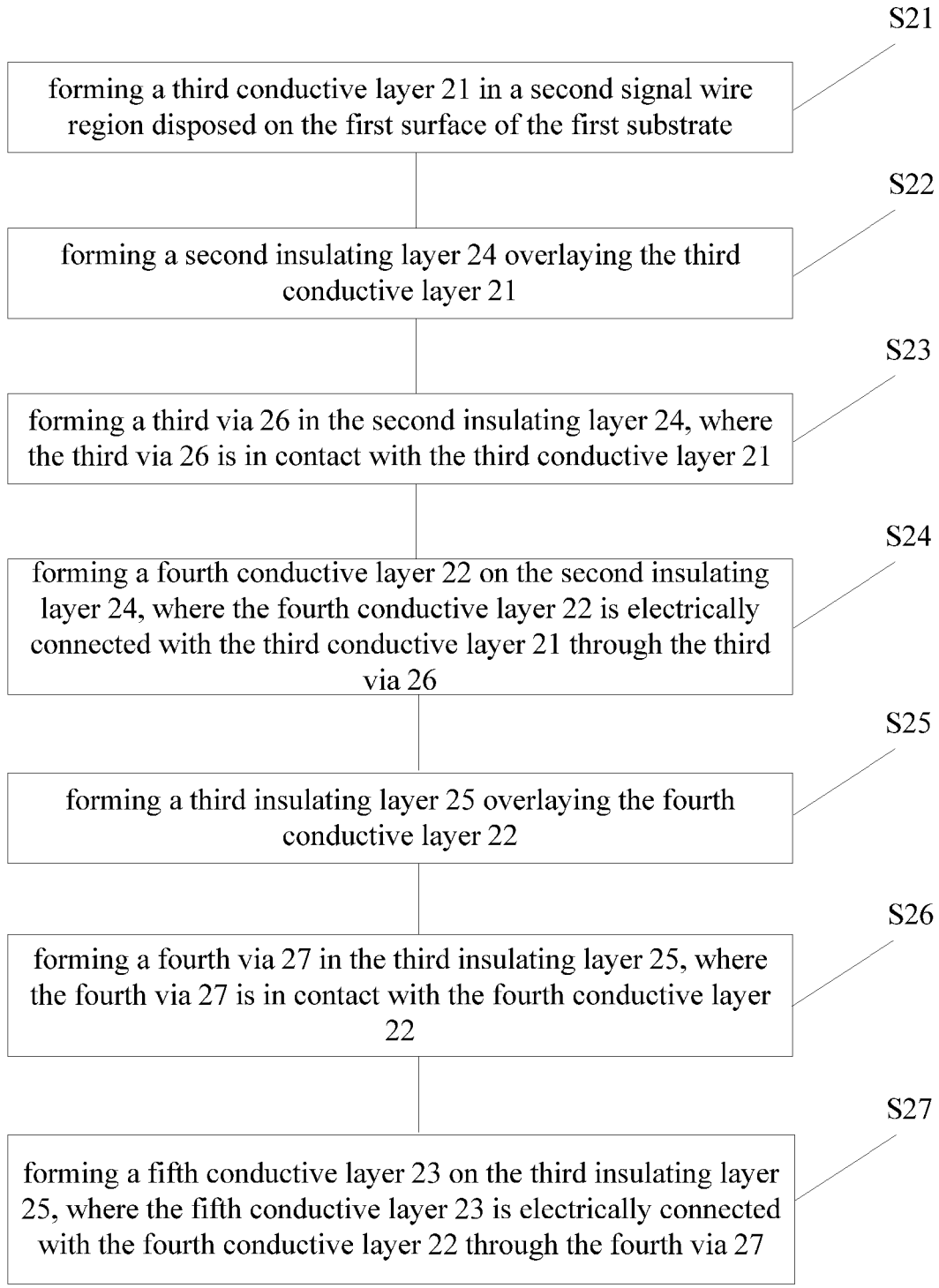
FIG. 22 is a flow chart of another process for forming an array substrate according to disclosed embodiments.

In some embodiments, the method may further include some steps as illustrated in FIG. 22, which are described hereinafter.

S21: forming a third conductive layer 21 in a second signal wire region disposed on the first surface of the first substrate;

S22: forming a second insulating layer 24 overlaying the third conductive layer 21;

S23: forming a third via 26 in the second insulating layer 24, where the third via 26 is in contact with the third conductive layer 21;

S24: forming a fourth conductive layer 22 on the second insulating layer 24, where the fourth conductive layer 22 is electrically connected with the third conductive layer 21 through the third via 26;

S25: forming a third insulating layer 25 overlaying the fourth conductive layer 22;

S26: forming a fourth via 27 in the third insulating layer 25, where the fourth via 27 is in contact with the fourth conductive layer 22; and S27: forming a fifth conductive layer 23 on the third insulating layer 25, where the fifth conductive layer 23 is electrically connected with the fourth conductive layer 22 through the fourth via 27.

Specifically, in some embodiments, the method may include:

forming a conductive layer on the first surface of the first substrate and etching the conductive layer to forming the first conductive layer 11 in the first signal wire region and the third conductive layer 21 in the second signal wire region disposed on the first surface of the first substrate;

forming the first insulating layer 13 on the first conductive layer 11 to completely overlay the first conductive layer 11 and the third conductive layer 21;

etching the first insulating layer 13 to form through holes partially exposing the first conductive layer 11 and the third conductive layer 21, and forming the first via 14 and the third via 26 in the through holes, such that the first via 14 is in contact with the first conductive layer 11, and the third via 26 is in contact with the third conductive layer 21;

forming a conductive layer on the first insulating layer 13, and etching the conductive layer to form the second conductive layer 12 in the first signal wire region and the fourth conductive layer 22 in the second signal wire region, such that the second conductive layer 12 is electrically connected with the first conductive layer 11 through the first via 14, and the fourth conductive layer 22 is electrically connected with the third conductive layer 21 through the third via 26;

forming the third insulating layer 25 overlaying the second conductive layer 12 and the fourth conductive layer 22;

etching the third insulating layer 25 to form through holes partially exposing the second conductive layer 12 and the fourth conductive layer 22, and forming the second via 4 and the fourth via 27 in the through holes, such that the second via 4 is in contact with the second conductive layer 12, and the fourth via 27 is in contact with the fourth conductive layer 22; and forming a conductive layer on the third insulating layer 25, and etching the conductive layer to form the connecting wires 3 in the first signal wire region and the fifth conductive layer 23 in the second signal wire region, such that the connecting wires 3 are electrically connected with the second conductive layer 12 through the second via 4, and the fifth conductive layer 23 is electrically connected with the fourth conductive layer 22 through the fourth via 27.

In some embodiments, the first conductive layer 11 and the third conductive layer 21 may be formed in the same process. In some embodiments, the second conductive layer 12 and the fifth conductive layer 23 may be formed in the same process. In some embodiments, the connecting wires 3 and the fourth conductive layer 22 may be formed in the same process. In some embodiments, the first conductive layer 11, the second conductive layer 12, the third conductive layer 21, the fourth conductive layer 22, the fifth conductive layer 23 and the connecting wires 3 are respectively formed in individual processes without being formed with any other component.

In some embodiments, any one of the third conductive layer 21, the fourth conductive layer 22 and the fifth conductive layer 23 may be in the same process with any one of the gate layer 5, the source/drain layer 6, the pixel electrode layer 7, the common electrode layer 8 and the signal transmitting wire layer 9. As long as the third conductive layer 21, the fourth conductive layer 22 and the fifth conductive layer 23 are not all set on the same layer, and they are electrically connected with each other, the width of the first signal wire 1 and the second signal 2 can be reduced under the circumstance that the resistance value remains. Therefore, the area of the frame region of the array substrate can be reduced.

In conclusion, in the array substrate provided in the present disclosure, the wire region includes a plurality of first signal wires 1 each of which has two electrically coupled conductive layers 11 and 12. That means, to obtain the same resistance value as that in prior art, the first signal wires 1 in the present disclosure can be formed with a reduced width. Therefore, if the quantity of the wires remains the same, the area of the wire region 202 in the array substrate may be smaller due to the reduced width, thereby reducing the area of the frame region of a display panel including such an array substrate.

Figure 23:
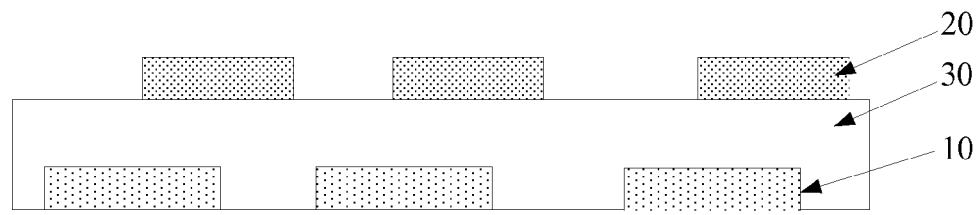
FIGS. 23 to 26 are cross sections of wire regions in array substrates according to disclosed embodiments.

Furthermore, another array substrate is provided according to disclosed embodiments. The array substrate may also include components as illustrated in FIG. 1, i.e., the array substrate also includes a display region 100 and a frame region 200. The frame region 200 includes a drive circuit region 201 and a wire region 202. In the wire region 202, there are formed a plurality of wires for connecting components in the drive circuit region 201 with components in the display region 100. The array substrate further includes some components as illustrated in FIG. 23. In the wire region 202, there are formed a first signal wire layer 10 stacked with a second signal wire layer 20. There is a first insulating layer 30 disposed between the first and the second signal wire layers 10 and 20. The first signal wire layer 10 includes a plurality of first signal wires extending along a first direction, and the second signal wire layer 20 includes a plurality of second signal wires extending along the first direction. Furthermore, at least one of the first signals wires and one of the second signal wires are at least partially overlapped along a direction perpendicular to the array substrate. In such configuration, the first and the second signal wires, which are conventionally disposed in the same layer, are disposed in different layers which are stacked with each other. Therefore, to arrange the wires with the same quantity as in the prior art, the wires required to be formed in each of the layers in this embodiment can be reduced. As such, the wire region of the array substrate can have a smaller size, and thus the whole frame region of a display panel including such an array substrate can also be smaller. It should be noted that, in some embodiments, the first direction may extend along a length direction of the frame region.

Further referring to FIG. 1, in some embodiments, there are multiple gate drive units (not shown in FIG. 1) and multiple connecting wires 3 disposed in the wire region 202. The connecting wires 3 are adapted for providing drive signals 1 to the gate drive units.

In some embodiments, signals transmitted through the first signal wire and the second signal wires may be different. In some embodiments, signals transmitted through the first signal wire and the second signal wires may be the same.

In some embodiments, the connecting wires 3 may be connected with the first signal wires in the first signal wire layer 10. In some embodiments, the connecting wires 3 may be connected with the second signal wires in the second signal wire layer 20. In some embodiments, some of the connecting wires 3 may be connected with the first signal wires in the first signal wire layer 10, some of the connecting wires 3 may be connected with the second signal wires in the second signal wire layer 20.

In some embodiments, the display region 100 may include a gate layer 5 in which gate electrodes are formed, a source/drain layer 6 in which source and drain electrodes are formed, a pixel electrode layer 7 in which pixel electrodes are formed, a common electrode layer 8 in which common electrodes are formed, and a signal transmitting wire layer 9 in which signal transmitting wires are formed. In some embodiments, the common electrode layer 8 may have a plurality of touch units formed therein. The touch units may function as common electrodes in a display period, and also function as touch electrodes in a touch period. Accordingly, the signal transmitting wires in the signal transmitting wire layer 9 are electrically connected with the touch units, so as to transmit common voltage signals to the touch units in the display period, and transmit touch signals to the touch units in the touch period.

In some embodiments, any one of the first signal wire layer 10 and the second signal wire layer 20 may be disposed not on the same layer with any one of the gate layer 5, the source/drain layer 6, the pixel electrode layer 7, the common electrode layer 8 and the signal transmitting wire layer 9. In some embodiments, any one of the first signal wire layer 10 and the second signal wire layer 20 may be disposed on the same layer with any one of the gate layer 5, the source/drain layer 6, the pixel electrode layer 7, the common electrode layer 8 and the signal transmitting wire layer 9. The present disclosure is not limited by specific positions of the above layers, as long as the first signal wire layer 10 and the second signal wire layer 20 are not set on the same layer, and they are electrically insulated with each other.

Figure 24:
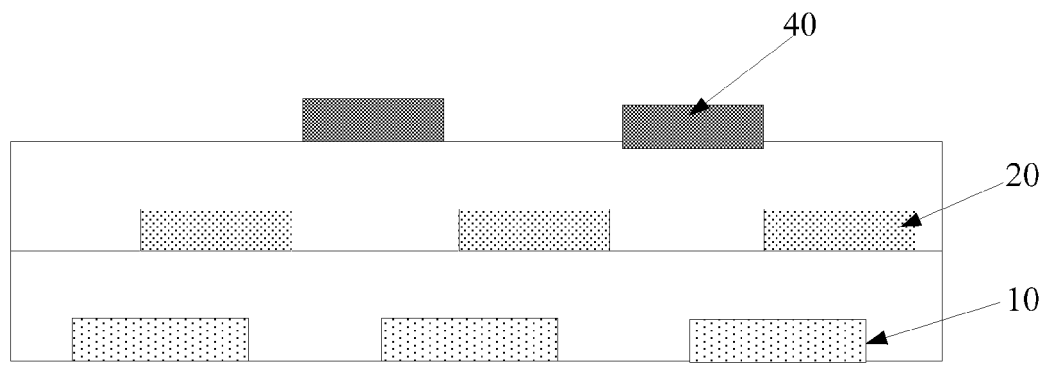

In some embodiments, as shown in FIG. 24, the wire region 202 further includes a third signal wire layer 40 which is electrically insulated from both the first signal wire layer 10 and the second signal wire layer 20. The third signal wire layer 40 includes a plurality of third signal wires extending along the first direction. The third signal wire layer may also at least partially overlap with any one of the first signal wire layer 10 and the second signal wire layer 20 along the direction perpendicular to the array substrate. Therefore, to arrange the wires with the same quantity as in the prior art, the wires required to be formed in each of the layers in this embodiment can be reduced. As such, the wire region of the array substrate can have a smaller size, and thus the whole frame region of a display panel including such an array substrate can also be smaller.

It should be noted that the signal wires in the first, the second and the third signal wire layers may be the same, or different, or partially the same, which is not limited in the present disclosure.

Figure 25:
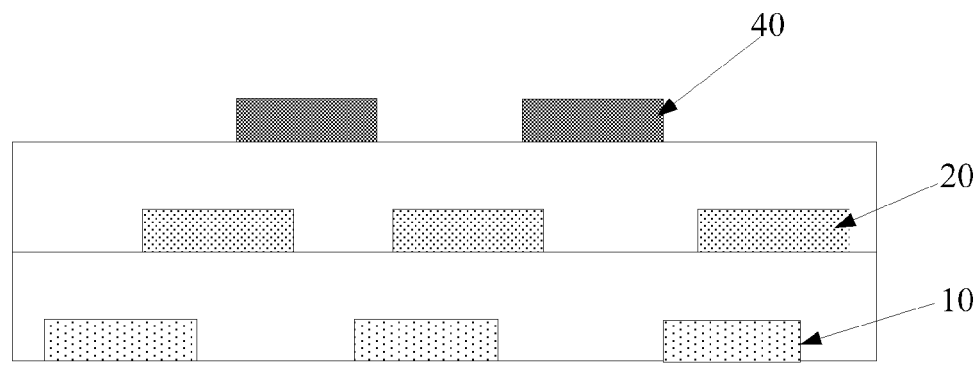
Figure 26:
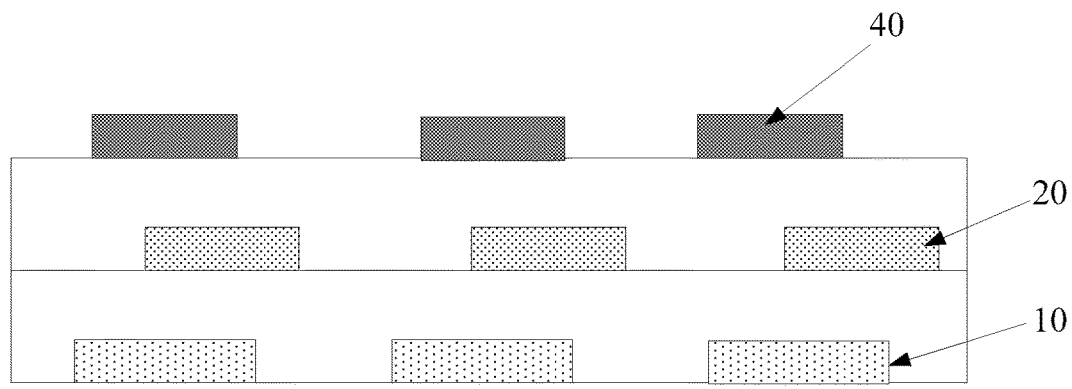

FIG. 24 schematically illustrates one embodiment in which the third signal wires partially overlap the first signal wires along the direction perpendicular to the array substrate. FIG. 25 schematically illustrates one embodiment in which the third signal wires partially overlap the second signal wires along the direction perpendicular to the array substrate. FIG. 26 schematically illustrates one embodiment in which the third signal wires partially overlap both the first signal wires and the second signal wires along the direction perpendicular to the array substrate.

In some embodiments, the third signal wire layer 40 may be disposed not on the same layer with any one of the gate layer 5, the source/drain layer 6, the pixel electrode layer 7, the common electrode layer 8 and the signal transmitting wire layer 9. In some embodiments, the third signal wire layer 40 may be disposed on the same layer with any one of the gate layer 5, the source/drain layer 6, the pixel electrode layer 7, the common electrode layer 8 and the signal transmitting wire layer 9. As such, the thickness of the array substrate may be reduced.

Figure 27:
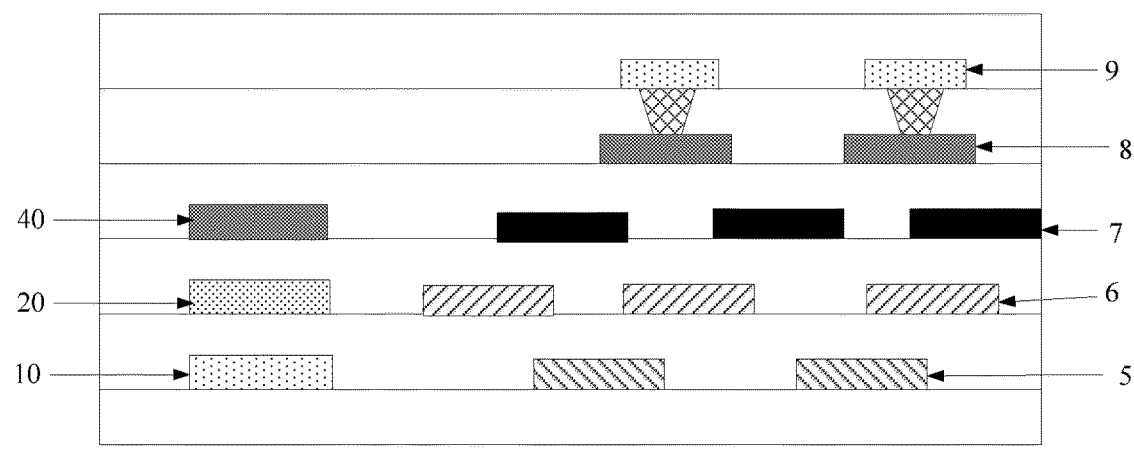
FIGS. 27 to 36 are cross sections of array substrates according to disclosed embodiments.

FIGS. 27 to 36 schematically illustrate how to dispose the signal wire layers according to disclosed embodiments. As shown in FIG. 27, in some embodiments, the first signal wire layer 10 is disposed on the same layer with the gate layer 5; the second signal wire layer 20 is disposed on the same layer with the source/drain layer 6; and the third signal wire layer 40 is disposed on the same layer with the pixel electrode layer 7.

Figure 28:
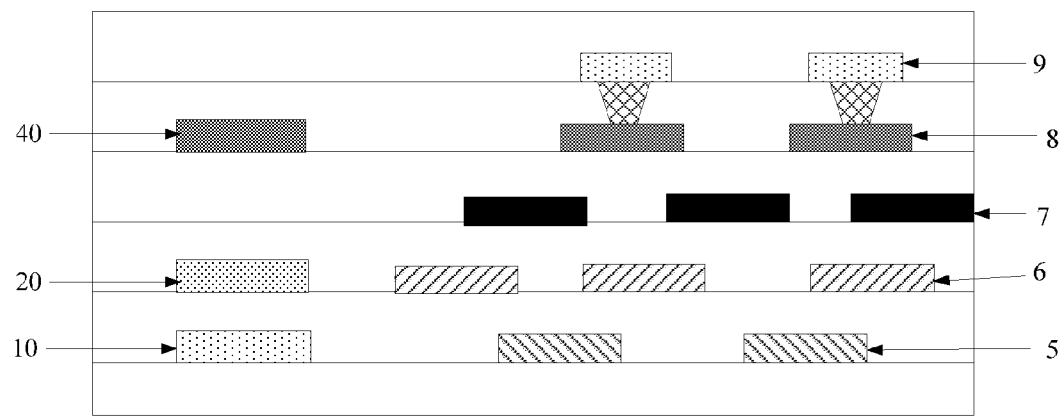

As shown in FIG. 28, in some embodiments, the first signal wire layer 10 is disposed on the same layer with the gate layer 5; the second signal wire layer 20 is disposed on the same layer with the source/drain layer 6; and the third signal wire layer 40 is disposed on the same layer with the common electrode layer 8.

Figure 29:
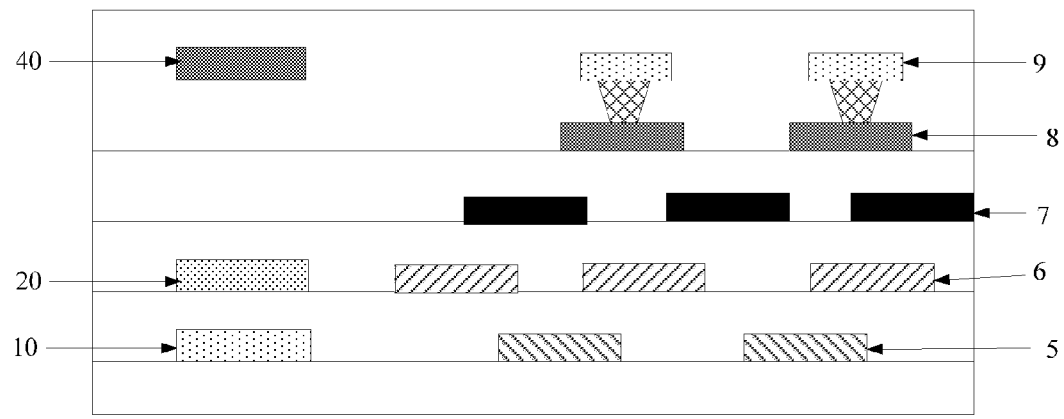

As shown in FIG. 29, in some embodiments, the first signal wire layer 10 is disposed on the same layer with the gate layer 5; the second signal wire layer 20 is disposed on the same layer with the source/drain layer 6; and the third signal wire layer 40 is disposed on the same layer with the signal transmitting wire layer 9.

Figure 30:
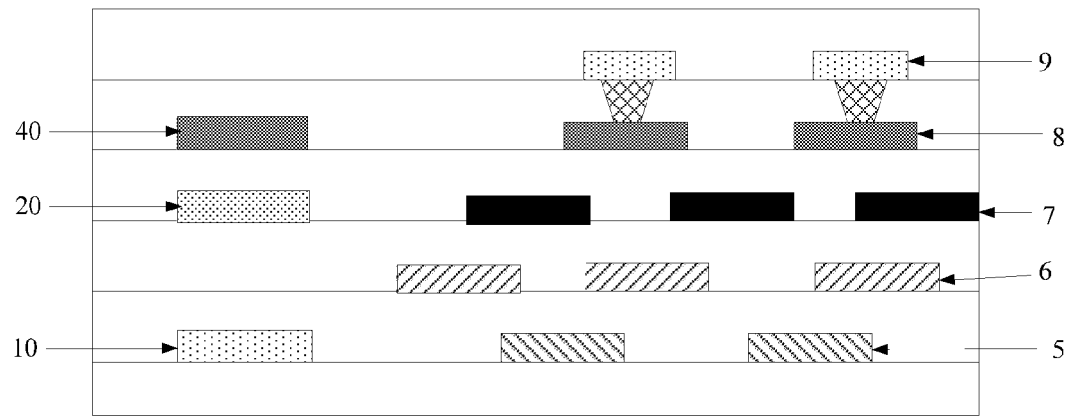

As shown in FIG. 30, in some embodiments, the first signal wire layer 10 is disposed on the same layer with the gate layer 5; the second signal wire layer 20 is disposed on the pixel electrode layer 7; and the third signal wire layer 40 is disposed on the same layer with the common electrode layer 8.

Figure 31:
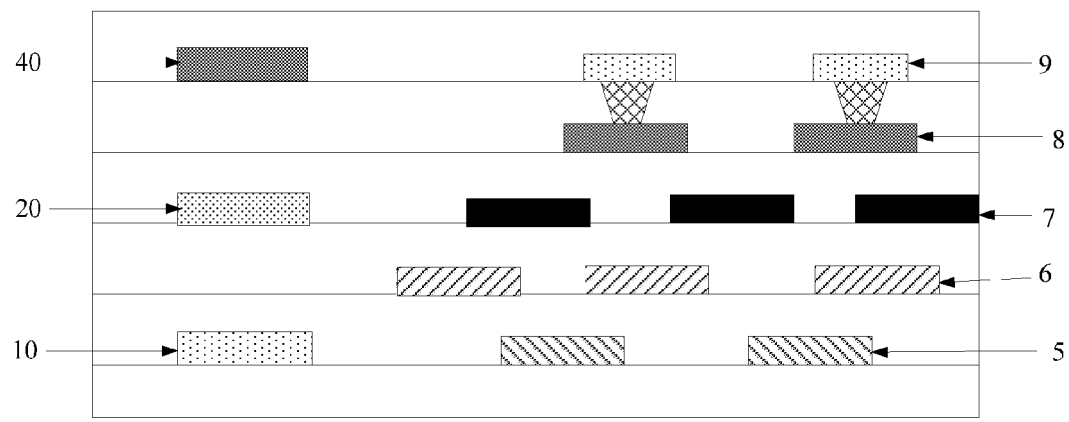

As shown in FIG. 31, in some embodiments, the first signal wire layer 10 is disposed on the same layer with the gate layer 5; the second signal wire layer 20 is disposed on the pixel electrode layer 7; and the third signal wire layer 40 is disposed on the same layer with the signal transmitting wire layer 9.

Figure 32:
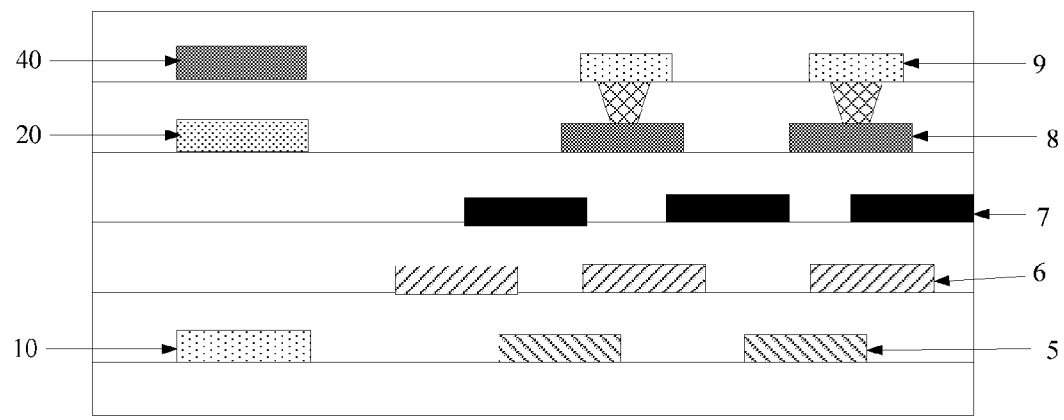

As shown in FIG. 32, in some embodiments, the first signal wire layer 10 is disposed on the same layer with the gate layer 5; the second signal wire layer 20 is disposed on the common electrode layer 8; and the third signal wire layer 40 is disposed on the same layer with the signal transmitting wire layer 9.

Figure 33:
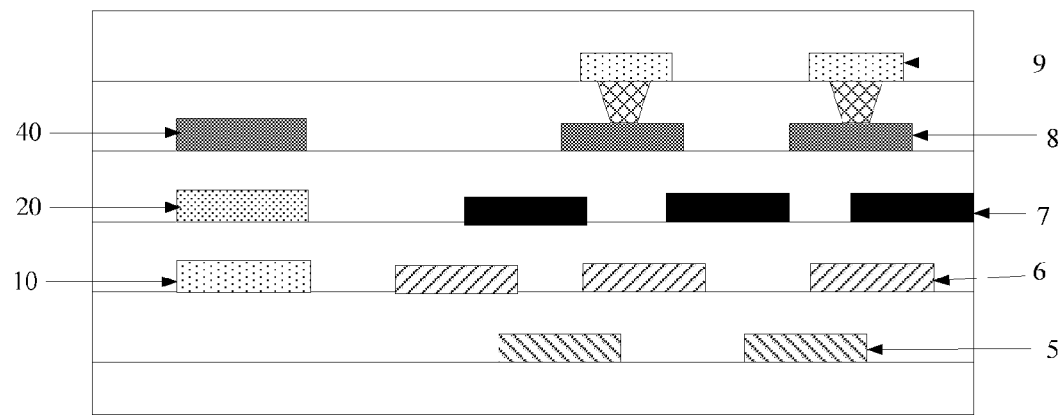

As shown in FIG. 33, in some embodiments, the first signal wire layer 10 is disposed on the source/drain layer 6; the second signal wire layer 20 is disposed on the pixel electrode layer 7; and the third signal wire layer 40 is disposed on the same layer with the common electrode layer 8.

Figure 34:
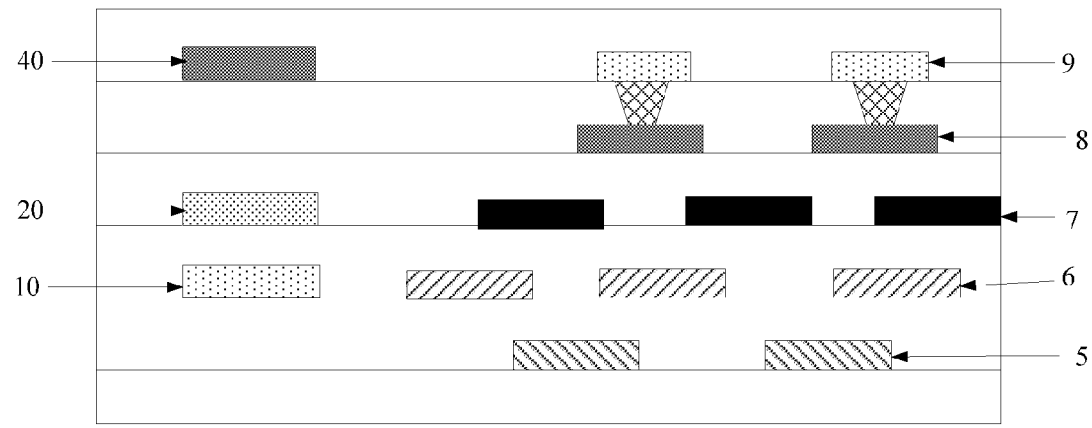

As shown in FIG. 34, in some embodiments, the first signal wire layer 10 is disposed on the source/drain layer 6; the second signal wire layer 20 is disposed on the pixel electrode layer 7; and the third signal wire layer 40 is disposed on the same layer with the signal transmitting wire layer 9.

Figure 35:
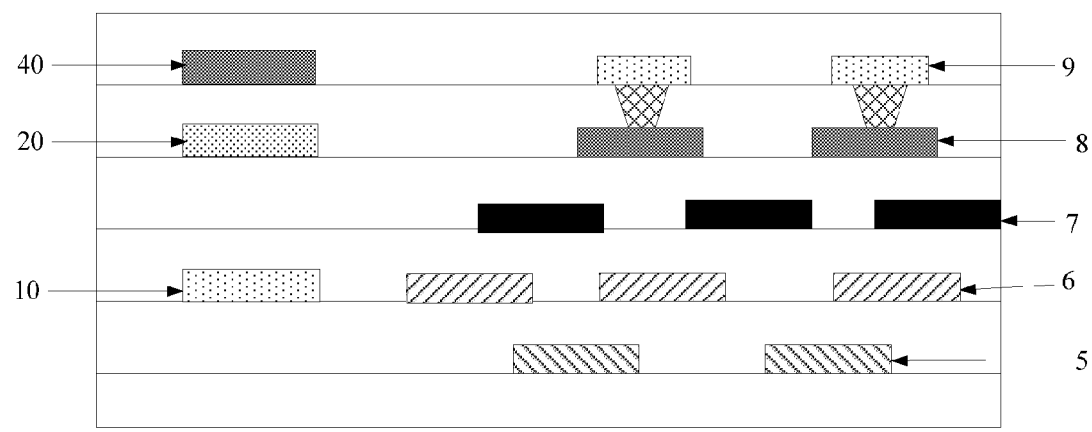

As shown in FIG. 35, in some embodiments, the first signal wire layer 10 is disposed on the source/drain layer 6; the second signal wire layer 20 is disposed on the common electrode layer 8; and the third signal wire layer 40 is disposed on the same layer with the signal transmitting wire layer 9.

Figure 36:
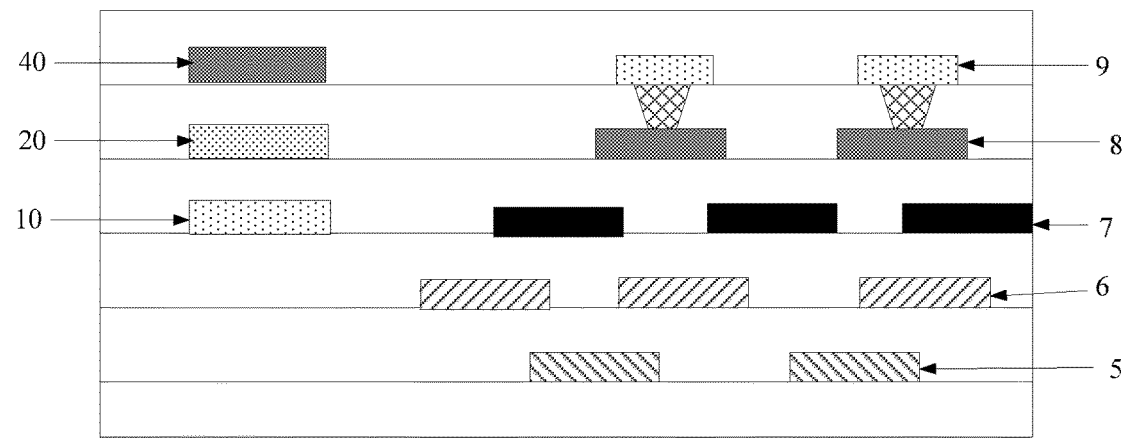

As shown in FIG. 36, in some embodiments, the first signal wire layer 10 is disposed on the pixel electrode layer 7; the second signal wire layer 20 is disposed on the common electrode layer 8; and the third signal wire layer 40 is disposed on the same layer with the signal transmitting wire layer 9.

It should be noted that the present disclosure is not limited by above embodiments. Specific positions of the first signal wire layer 10, the second signal wire layer 20 and the third signal wire layer 40 may be interchanged, and positions of the pixel electrode layer 7, the common electrode 8 and the signal transmitting wire layer 9 also may be interchanged.

In some embodiments, if any one of the first signal wire layer 10, the second signal wire layer 20 and the third signal wire layer 40 is disposed on the same layer of any one of the layers in the display region, the layers on the same layer may be formed with the same material, such that they can be formed in the same process to reduce the manufacturing processes. Therefore, formation efficiency may be improved and cost may be reduced.

In the array substrate provided in some embodiments, multiple signal wire layers are disposed in different layers which are stacked with each other. Therefore, to arrange the wires with the same quantity as in the prior art, the wires required to be formed in each of the layers in the present disclosure can be reduced. As such, the wire region of the array substrate can have a smaller size, and thus the whole frame region of a display panel including such an array substrate can also be smaller.

Figure 37:
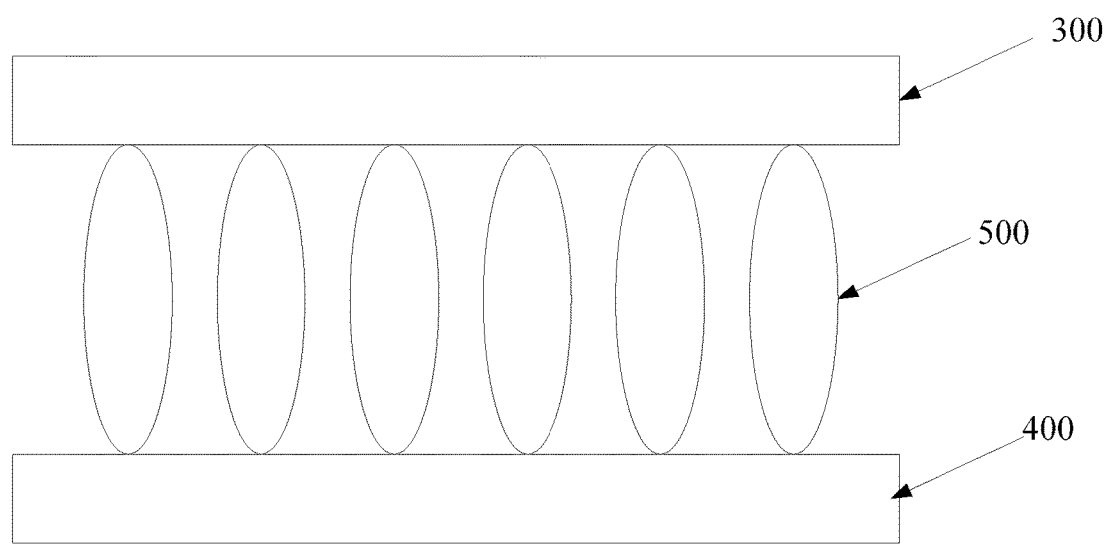
FIG. 37 is a cross section of a display panel according to disclosed embodiments.

Furthermore, a display panel is provided according to disclosed embodiments. As shown in FIG. 37, the display panel includes an array substrate 300 and a color film substrate 400 which are face to face with each other. A liquid crystal display layer 500 is disposed between the array substrate 300 and the color film substrate 400. The array substrate 300 may be any one of the array substrate described in above embodiments.

As the array substrate provided in embodiments of the present disclosure has a smaller wire region, compared with conventional array substrates and under the circumstance that the wire quantity is the same, it can have a smaller frame region. Therefore, the display panel including such an array substrate may have a smaller frame region.

Embodiments of the present disclosure may have different features. However, similar features also exist, detail information of which can be obtained by referring to other embodiments.

The present disclosure is disclosed, but not limited, by preferred embodiments as above. Based on the disclosure of the present disclosure, those skilled in the art can make any variation and modification without departing from the scope of the disclosure. Therefore, any simple modification, variation and polishing based on the embodiments described herein is within the scope of the present disclosure.

What is claimed is:

1. A display panel, comprising:
an array substrate, the array substrate comprising:
a display region and a frame region, wherein the frame region comprises a drive circuit region and a wire region, wherein wires in the wire region electrically connect components in the drive circuit region with components in the display region;
a plurality of first signal wires disposed in the wire region, wherein each of the first signal wires comprises:
a first conductive layer stacked with a second conductive layer;
a first insulating layer disposed between the first conductive layer and the second conductive layer; and
a first via formed between the first conductive layer and the second conductive layer, electrically connecting the first conductive layer with the second conductive layer;
and
a plurality of gate drive units and a plurality of connecting wires electrically connected with the plurality of gate drive units both disposed in the wire region, wherein the connecting wires are also electrically connected with the first signal wires through a second via, such that drive signals are transmitted from the first signal wires to the gate drive units through the connecting wires.

2. The display panel of claim 1, wherein the display region includes a gate layer, a source/drain layer, a pixel electrode layer, a common electrode layer and a signal transmitting wire layer,
wherein the common electrode layer includes a plurality of touch units, the plurality of touch units being configured to function as common electrodes in a display period, and to function as touch electrodes in a touch period,
wherein the signal transmitting wire layer includes a plurality of signal transmitting wires, the plurality of signal transmitting wires being electrically connected with the touch units, so as to transmit common voltage signals to the touch units in the display period, and to transmit touch signals to the touch units in the touch period, and
wherein the first conductive layer is disposed on the same layer as the gate layer, and the connecting wires are disposed on the same layer as the source/drain layer; or else, the first conductive layer is disposed on the same layer with the source/drain layer, and the connecting wires are disposed on the same layer with the gate layer.

3. The display panel of claim 2, wherein the second conductive layer is disposed on the same layer as the pixel electrode layer or disposed on the same layer as the common electrode layer.

4. The display panel of claim 2, wherein the second conductive layer is configured on the same layer as the signal transmitting wire layer.

5. The display panel of claim 4, wherein the second conductive layer is made of metal.

6. The display panel of claim 1, wherein the wire region includes a plurality of second signal wires, each of the second signal wires comprising:
a third conductive layer, a fourth conductive layer and a fifth conductive layer stacked with each other;
a second insulating layer disposed between the third conductive layer and the fourth conductive layer;
a third insulating layer disposed between the fourth conductive layer and the fifth conductive layer;
a third via disposed between the third conductive layer and the fourth conductive layer, the third via electrically connecting the third conductive layer with the fourth conductive layer; and
a fourth via disposed between the fourth conductive layer and the fifth conductive layer, the fourth via electrically connecting the fourth conductive layer with the fifth conductive layer.

7. The display panel of claim 6, wherein the third conductive layer is disposed on the same layer with the gate layer, or disposed on the same layer as the source/drain layer, or disposed on the same layer as the pixel electrode layer.

8. The display panel of claim 6, wherein the fourth conductive layer is disposed on the same layer as the source/drain layer, or disposed on the same layer as the pixel electrode layer, or disposed on the same layer as the common electrode layer, or disposed on the same layer as the signal transmitting wire layer.

9. The display panel of claim 6, wherein the fifth conductive layer is disposed on the same layer as the pixel electrode layer, or disposed on the same layer as the common electrode layer, or disposed on the same layer as the signal transmitting wire layer.

10. A method for forming an array substrate of a display panel, the method comprising:
providing a first substrate;
forming a first conductive layer in a first signal wire region of a wire region, where the wire region is disposed on a first surface of the first substrate;
forming a first insulating layer overlaying the first conductive layer;
forming a first via in the first insulating layer, wherein the first via is in contact with the first conductive layer;
forming a second conductive layer on the first insulating layer, wherein the first conductive layer and the second conductive layer are electrically connected through the first via; and
forming, in the wire region, a plurality of gate drive units and a plurality of connecting wires electrically connected with the gate drive units, wherein each of the connecting wires is electrically connected with one of the first signal wires through a second via, such that drive signals are transmitted from the first signal wires to the gate drive units.

11. The method of claim 10, further comprising:
forming, in the display region, a gate layer, a source/drain layer, a pixel electrode layer, a common electrode layer and a signal transmitting wire layer,
wherein the common electrode layer includes a plurality of touch units, the plurality of touch units configured to function as common electrodes in a display period, and to function as touch electrodes in a touch period,
wherein the signal transmitting wire layer includes a plurality of signal transmitting wires, the plurality of signal transmitting wires configured to be electrically connected with the touch units, so as to transmit common voltage signals to the touch units in the display period, and to transmit touch signals to the touch units in the touch period, and
wherein the first conductive layer and the gate layer are formed in the same process, and the connecting wires and the source/drain layer are formed in the same process, or else, first conductive layer and the source/drain layer are formed in the same process, and the connecting wires and the gate layer are formed in the same process.

12. The method of claim 11, wherein the second conductive layer is formed in the same process with the pixel electrode layer, the common electrode layer or the signal transmitting wire layer.

13. The method of claim 10, further comprising:
forming a third conductive layer in a second signal wire region disposed on the first surface of the first substrate;
forming a second insulating layer overlaying the third conductive layer;
forming a third via in the second insulating layer, wherein the third via is in contact with the third conductive layer;
forming a fourth conductive layer on the second insulating layer, wherein the fourth conductive layer is electrically connected with the third conductive layer through the third via;
forming a third insulating layer overlaying the fourth conductive layer;
forming a fourth via in the third insulating layer, wherein the fourth via is in contact with the fourth conductive layer; and
forming a fifth conductive layer on the third insulating layer, wherein the fifth conductive layer is electrically connected with the fourth conductive layer through the fourth via.

14. The method of claim 13, wherein the third conductive layer is formed in the same process with the gate layer, the source/drain layer or the pixel electrode layer.

15. The method of claim 13, wherein the fourth conductive layer is formed in the same process with the source/drain layer, the pixel electrode layer, the common electrode layer or the signal transmitting wire layer.

16. The method of claim 13, wherein the fifth conductive layer is formed in the same process with the pixel electrode layer, the common electrode layer or the signal transmitting wire layer.

17. A display panel, comprising:
a display region and a frame region, wherein the frame region comprises a drive circuit region and a wire region, wherein wires in the wire region electrically connect components in the drive circuit region with components in the display region, and wherein the wire region comprises:
a first signal wire layer stacked with a second signal wire layer;
a first insulating layer disposed between the first signal wire layer and the second signal wire layer; and
a third signal wire layer electrically insulated from both the first signal wire layer and the second signal wire layer,
wherein the first signal wire layer comprises a plurality of first signal wires extending along a first direction, and the second signal wire layer comprises a plurality of second signal wires extending along the first direction;
wherein at least one of the first signals wires and one of the second signal wires are at least partially overlapped along a direction perpendicular to the array substrate; and
wherein the third signal wire layer comprises a plurality of third signal wires extending along the first direction, and wherein the third signal wire layer at least partially overlaps with any one or both of the first signal wire layer and the second signal wire layer along the direction perpendicular to the array substrate.

* * * * *